(12) United States Patent
Lee et al.

(10) Patent No.: US 7,892,918 B2
(45) Date of Patent: Feb. 22, 2011

(54) METHOD OF FABRICATING A SEMICONDUCTOR DEVICE INCLUDING FORMATION OF CONTACT HOLES

(75) Inventors: Ji-Yoon Lee, Seoul (KR); Hyuck-Chai Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 184 days.

(21) Appl. No.: 12/170,115

(22) Filed: Jul. 9, 2008

(65) Prior Publication Data

US 2009/0020879 A1 Jan. 22, 2009

(30) Foreign Application Priority Data

Jul. 18, 2007 (KR) .................. 10-2007-0071802

(51) Int. Cl.
*H01L 21/8242* (2006.01)
(52) U.S. Cl. .............. 438/253; 438/256; 438/396; 438/399; 257/E23.168; 257/E21.585
(58) Field of Classification Search ......... 438/253–256, 438/396–399
See application file for complete search history.

(56) References Cited

U.S. PATENT DOCUMENTS 6,163,047 A * 12/2000 Sung et al. ............... 257/306

FOREIGN PATENT DOCUMENTS

| KR | 1020040078413 | 9/2004 |
|---|---|---|
| KR | 0455729 | 10/2004 |
| KR | 557997 | 2/2006 |

* cited by examiner

*Primary Examiner*—Thanh Nguyen
(74) *Attorney, Agent, or Firm*—Volentine & Whitt, P.L.L.C.

(57) ABSTRACT

A wiring structure in a semiconductor device includes a first insulation layer formed on a substrate having first and second contact regions, and first and second pads extending through the first insulation layer and contacting the first and the second contact regions. The first and the second pads are higher than the first insulation layer. A blocking layer pattern is formed on the first insulation layer between the first and the second pads, the blocking layer pattern being higher than the first and the second pads. A second insulation layer is formed on the blocking layer pattern and the first and the second pads. A bit line structure is formed on the second insulation layer, the bit line structure electrically contacting the second pad. A third insulation layer is formed on the second insulation layer and the bit line structure. A plug extends through the second and the third insulation layers and contacts the first pad.

13 Claims, 10 Drawing Sheets

METHOD OF FABRICATING A SEMICONDUCTOR DEVICE INCLUDING FORMATION OF CONTACT HOLES

CROSS-REFERENCE TO RELATED PATENT APPLICATION

A claim of priority is made to Korean Patent Application No. 10-2007-0071802, filed on Jul. 18, 2007, the subject matter of which is hereby incorporated by reference.

BACKGROUND OF THE INVENTION

1. Field of the Invention

Example embodiments of the present invention relate to a wiring structure in a semiconductor device and a method of fabricating a wiring structure in a semiconductor device. More particularly, example embodiments of the present invention relate to a wiring structure having a plug extending through insulation layers and a method of fabricating the wiring structure.

2. Description of the Related Art

As semiconductor devices are required to have more rapid response speeds and higher storage capacities, manufacturing technology has been developed to produce highly integrated semiconductor devices with improved reliability, etc. A dynamic random access memory (DRAM) has been widely used as a semiconductor memory device in various electronic and electric apparatuses because of the relatively rapid response speed and high storage capacity. DRAM devices generally include unit memory cells, each of which includes an access transistor and a storage capacitor.

As design requirements for the DRAM devices have generally required decreased size, the unit memory cells of the DRAM devices occupy significantly reduced areas. The capacitor therefore may not have a desired high capacitance. To improve an effective area of the capacitor, the structure of the capacitor has been changed from a planar type to a stacked type, a trench type, a cylindrical type, etc.

A cylindrical capacitor of a semiconductor device, in particular, makes electrical contact with a contact region of an access transistor. Therefore, a portion of the capacitor depends on formation of the transistor on a substrate. Adjacent capacitors may be connected to each other, potentially causing electrical failure, because the area allowed for formation of the capacitors is very small. Further, a capacitor may not be properly connected to a corresponding access transistor when the capacitor is formed in a very small area of the substrate.

Recent designs provide for larger areas for plugs on substrates to ensure proper electrical contact between transistors and capacitors, even though the capacitors are very small. Alternatively, additional landing pads, relatively large in size, may be formed on plugs electrically connected to transistors in order to improve the electrical connections between the transistors and the capacitors.

However, bridges may be easily formed between adjacent plugs, thereby causing electrical failures or shorts between the adjacent plugs, when the plugs are larger. Further, manufacturing processes for forming capacitors may be complicated when the landing pads are also on the plugs, and alignment errors between the landing pads and the plugs may result.

SUMMARY ON THE INVENTION

According to one aspect of the present invention, there is provided a wiring structure in a semiconductor device, which includes a first insulation layer, a first pad and a second pad, a blocking layer pattern, a second insulation layer, a bit line structure, a third insulation layer and a plug. The first insulation layer is on a substrate having a first contact region and a second contact region. The first pad and the second pad extend through the first insulation layer and contact the first contact region and the second contact region, respectively. The first and the second pads are higher than the first insulation layer. The blocking layer pattern is on the first insulation layer between the first pad and the second pad. The blocking layer pattern is higher than the first and the second pads. The second insulation layer is on the blocking layer pattern, the first pad and the second pad. The bit line structure is on the second insulation layer, and electrically contacts the second pad. The third insulation layer is on the second insulation layer and the bit line structure. The plug extends through the second and the third insulation layers and contacts the first pad.

In various embodiments, the bit line structure may include a bit line on the second insulation layer, a bit line mask on the bit line, and a bit line spacer positioned on sidewalls of the bit line and the bit line mask. The bit line may extend to the second pad.

In various embodiments, the plug may be located in an opening that exposes the first pad, the blocking layer pattern and a portion of the second pad. The plug may include a lower portion and an upper portion. The lower portion may be wider than the upper portion. Also, the wiring structure may further include a spacer between the plug and the bit line structure. The spacer may cover the portion of the second pad exposed through the opening.

According to another aspect of the present invention, there is provided a method of fabricating a wiring structure in a semiconductor device. The method includes forming a first insulation layer on a substrate having a first contact region and a second contact region; forming a first pad and a second pad on the first contact region and the second contact region, respectively, wherein the first and the second pads are higher than the first insulation layer; and forming a blocking layer pattern on the first insulation layer between the first pad and the second pad, wherein the blocking layer pattern is higher than the first and the second pads. A second insulation layer is formed on the blocking layer pattern, the first pad and the second pad. An opening is formed by partially etching the second insulation layer to expose the first pad and the blocking layer pattern, and a spacer is formed on a sidewall of the opening. A plug is formed on the first pad to fill the opening.

In various embodiments, forming the first insulation layer and forming the first and the second pads may include forming a preliminary first insulation layer on the substrate, partially etching the preliminary first insulation layer to form contact holes exposing the first and the second contact regions, respectively, forming the first and the second pads in the contact holes, and partially removing the preliminary first insulation layer to form the first insulation layer. Also, forming the first and the second pads may include forming a conductive layer on the preliminary first insulation layer to fill the contact holes, and removing the conductive layer until the preliminary first insulation layer is exposed.

In various embodiments, partially removing the preliminary first insulation layer may include a wet etching process or a dry etching process.

In various embodiments, forming the blocking layer pattern may include forming a blocking layer on the first insulation layer, the first pad and the second pad, and partially etching the blocking layer. The blocking layer may be formed using a material that has an etching selectivity with respect to the first insulation layer, the second insulation layer and/or the third insulation layer.

In various embodiments, the method may further include forming a bit line structure on the second insulation layer before forming the opening. Forming the bit line structure may include forming a contact hole by partially etching the second insulation layer to expose the second pad, forming a bit line on the second insulation layer to fill the contact hole, forming a bit line mask on the bit line, and forming a bit line spacer on sidewalls of the bit line and the bit line mask. The opening may further expose a portion of the second pad, and the spacer extends on the exposed portion of the second pad.

According to still another aspect of the present invention, there is provided a method of manufacturing a semiconductor device. In the method of manufacturing the semiconductor device, a conductive structure is formed on a substrate, the conductive structure including a first contact region and a second contact region formed on the substrate. A first insulation layer is formed on the substrate to cover the conductive structure. A blocking layer pattern is formed on the first insulation layer. A first contact hole and a second contact hole are formed through the first insulation layer using the blocking layer pattern to expose the first contact region and the second contact region, respectively. A first pad and a second pad are formed in the first contact hole and the second contact hole, respectively. The first and the second pads are substantially higher than the first insulation layer, and substantially lower than the blocking layer pattern. A second insulation layer is formed on the blocking layer pattern, the first pad and the second pad. A third contact hole is formed by partially etching the second insulation layer to expose the second pad. A bit line structure is formed on the second insulation layer to fill the third contact hole. A third insulation layer is formed on the second insulation layer to cover the bit line structure. An opening is formed by partially etching the third insulation layer and the second insulation layer to expose the first pad and the blocking layer pattern. A spacer is formed on a sidewall of the opening. A plug is formed on the first pad to fill the opening.

In various embodiments, forming the opening may include exposing a portion of the second pad. The opening may have a lower width substantially larger than an upper width.

In various embodiments, the spacer may be formed between the plug and the bit line structure and extend to the exposed portion of the second pad. Also, forming the bit line structure may include forming a bit line on the second insulation layer to fill the third contact hole, forming a bit line mask on the bit line, and forming a bit line spacer on sidewalls of the bit line and the bit line mask.

According to still another aspect of the present invention, there is provided a method of manufacturing a semiconductor device. In the method of manufacturing the semiconductor device, a conductive structure is formed on a substrate. The conductive structure includes a first contact region and a second contact region formed on the substrate. A first insulation layer is formed on the substrate to cover the conductive structure. A blocking layer pattern is formed on the first insulation layer. A first contact hole and a second contact hole are formed through the first insulation layer using the blocking layer pattern to expose the first contact region and the second contact region. A first pad and a second pad are formed in the first contact hole and the second contact hole. The first and the second pads are substantially higher than the first insulation layer, and are substantially lower than the blocking layer pattern. A second insulation layer is formed on the blocking layer pattern, the first pad and the second pad. A third contact hole is formed by partially etching the second insulation layer to expose the second pad. A bit line structure is formed on the second insulation layer to fill the third contact hole. A third insulation layer is formed on the second insulation layer to cover the bit line structure. An opening is formed by partially etching the third and the second insulation layers to expose the first pad and the blocking layer pattern. A spacer is formed on a sidewall of the opening, and a plug is formed on the first pad to fill the opening.

In various embodiments, the first and the second pads may be substantially higher than the first insulation layer, and the blocking layer pattern may be substantially higher than the first and the second pads. Further, the wiring structure may include the plug on the first pad, the bit line structure on the second pad, and the spacer positioned between the plug and the bit line structure. Since the plug may be effectively insulated from the bit line and the second pad by the spacer, and the first pad may be completely insulated from the second pad by the blocking layer pattern and the spacer, the wiring structure has improved electrical characteristics without electrical failures and/or shorts. Additionally, since the lower portion of the plug may be substantially larger than the upper portion, the wiring structure may have enhanced structural stability. When the semiconductor device includes the wiring structure, the semiconductor device may also have improved electrical characteristics and reliability.

BRIEF DESCRIPTION OF THE DRAWINGS

The embodiments of the present invention will be described with reference to the attached drawings, in which.

DESCRIPTION OF THE EMBODIMENTS

Figure 1:
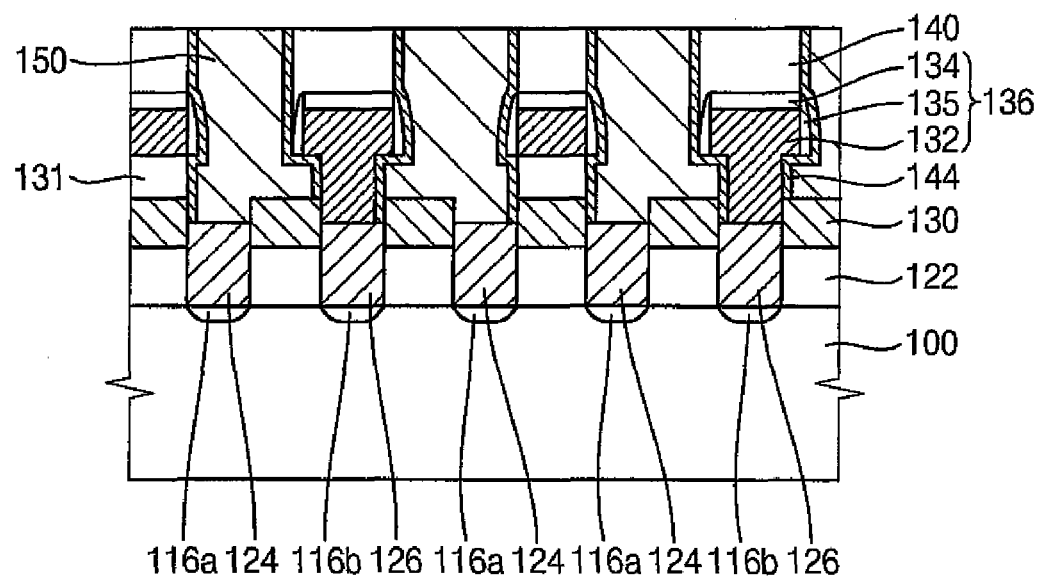
FIG. 1 is a cross-sectional view illustrating a wiring structure in a semiconductor device, according to example embodiments of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Also, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc., may be used to describe various elements, components, regions, layers and/or sections, these elements, components, regions, layers and/or sections should not be limited by these terms. These terms are only used to distinguish one element, component, region, layer or section from another. Thus, for example, a first element, component, region, layer or section discussed below could be termed a second element, component, region, layer or section without departing from the teachings of the present invention.

Spatially relative terms, such as "beneath," "below," "lower," "above," "upper" and the like, may be used for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification or the claims, specify the presence of stated features, integers, steps, operations, elements, and/or components, but do not preclude the presence or addition of one or more other features, integers, steps, operations, elements, components, and/or groups thereof.

Exemplary embodiments of the invention are described with reference to cross-sectional illustrations that are schematic illustrations of the embodiments (and intermediate structures) of the present invention. As such, variations from the shapes of the illustrations as a result, for example, of manufacturing techniques and/or tolerances, are to be expected. Thus, the embodiments of the present invention should not be construed as limited to the particular shapes of regions illustrated in the figures, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and the depicted shapes are not intended to illustrate the exact actual shape of a corresponding region of a device, and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention provide a semiconductor device wiring structure, which includes a blocking layer pattern and spacer to effectively prevent electrical failures and improve electrical characteristics. Exemplary embodiments of the present invention also provide a method of fabricating a wiring structure having a blocking layer pattern and spacer to prevent electrical failures and improve electrical characteristics.

FIG. 1 is a cross-sectional view illustrating a wiring structure in a semiconductor device, according to example embodiments of the present invention.

Referring to FIG. 1, the wiring structure includes a first insulation layer 122, a first pad 124, a second pad 126, a blocking layer pattern 130, a bit line structure 136, a second insulation layer 131, a third insulation layer 140, a spacer 144 and a plug 150.

The first insulation layer 122 is provided a substrate 100. The substrate 100 may include a silicon-on-insulator (SOI) substrate, a germanium-on-insulator (GOI) substrate or a semiconductor substrate, such as a silicon substrate, a germanium substrate, a silicon germanium substrate, etc.

In various example embodiments, an isolation layer (not illustrated) may be formed on the substrate 100 to define an active region and a field region of the substrate 100. The wiring structure may be positioned in the active region of the substrate 100. The isolation layer may be formed by an isolation process, such as a shallow trench isolation (STI) process or a thermal oxidation process. The isolation layer may include an oxide such as undoped silicate glass (USG), spin on glass (SOG), followable oxide (FOX), tetraethyl ortho silicate (TEOS), plasma enhanced-tetraethyl ortho silicate (PE-TEOS), high density plasma-chemical vapor deposition (HDP-CVD) oxide, etc.

In various example embodiments, a conductive structure such as a gate structure (not illustrated) may be provided on the substrate 100. The conductive structure further includes a first contact region 116a and a second contact region 116b formed at predetermined portions of the substrate 100. For example, the first and the second contact regions 116a and 116b may be located at portions of the substrate 100 adjacent to the gate structure.

The first insulation layer 122 covers the conductive structure on the substrate 100. The first insulation layer 122 may include an oxide, such as silicon oxide or the like. For example, the first insulation layer 122 may include borophosphor silicate glass (BPSG), phosphor silicate glass (PSG), SOG, USG, FOX, TEOS, PE-TEOS, HDP-CVD oxide, etc.

A first contact hole (not illustrated) and a second contact hole (not illustrated) are provided through the first insulation layer 122. The first and the second contact holes expose the first and the second contact regions 116a and 116b, respectively. The first pad 124, which fills the first contact hole, is disposed on the first contact region 116a, and the second pad 126, which fills the second contact hole, is positioned on the second contact region 116b. That is, the first and the second pads 124 and 126 may make electrical contact with the first and the second contact regions 116a and 116b, respectively.

The first and the second pads 124 and 126 may independently include a metal, a metal compound, doped polysilicon, or the like. For example, each of the first and the second pads 124 and 126 may include tungsten (W), aluminum (Al), titanium (Ti), tantalum (Ta), copper (Cu), titanium nitride (TiNx), aluminum nitride (AlNx), titanium aluminum nitride (TiAlxNy), tungsten nitride (WNx), polysilicon doped with impurities, etc., which may be used alone or in various mixtures thereof. The first and the second pads 124 and 126 may have single layer structures, respectively. Alternatively, each of the first and the second pads 124 and 126 may have a multi-layer structure.

In various example embodiments, the first insulation layer 122 may have a height substantially less than the respective heights of the first and the second pads 124 and 126. For example, the height of the first insulation layer 122 may be substantially less than the heights of the first and the second pads 124 and 126. In other words, the first and the second pads 124 and 126 may be substantially higher than the first insulation layer 122, as illustrated in FIG. 1. Thus, the first pad 124 may be electrically insulated from the second pad 126 by the first insulation layer 122.

In various example embodiments, the first pad 124 in the first contact hole is electrically connected to a capacitor (not illustrated) of a semiconductor memory device, such as a dynamic random access memory (DRAM) device. Here, the first contact region 116*a* may correspond to a capacitor contact region to which a lower electrode of the capacitor is electrically connected. The second pad 126 on the second contact region 116*b* may make electrical contact with the bit line structure 136. Thus, the second contact region 116*b* may correspond to a bit line contact region to which the bit line structure 136 is electrically connected.

In various example embodiments, multiple first and second pads 124 and 126 may be alternately disposed on the substrate 100. In this case, adjacent first and second pads 124 and 126 may be isolated by the first insulation layer 122. Each of the first and the second pads 124 and 126 may have a diode structure formed using doped polysilicon, for example.

The blocking layer pattern 130 is disposed on a portion of the first insulation layer 122 between the first pad 124 and the second pad 126. The blocking layer pattern 130 may include a material having an etching selectivity with respect to the first insulation layer 122. For example, the blocking layer pattern 130 may include a nitride, such as silicon nitride, or an oxynitride, such as silicon oxynitride or titanium oxynitride.

In various example embodiments, the blocking layer pattern 130 may protrude from the first insulation layer 122, so that an upper face of the blocking layer pattern 130 is higher than upper faces of the first and second pads 124 and 126. For example, the upper face of the blocking layer pattern 130 may be substantially higher than the upper faces of the first and the second pads 124 and 126. Since the blocking layer pattern 130 is higher than the first and the second pads 124 and 126, a metal silicide layer (not illustrated) formed between the second pad 126 and the bit line structure 136 is not connected to the first pad 124. That is, the blocking layer pattern 130 effectively blocks an extension of the metal silicide layer between the second pad 126 and the bit line structure 136. Additionally, the first pad 124 may be securely insulated from the second pad 126 because of the blocking layer pattern 130 provided on the first insulation layer 122. Furthermore, the spacer 144 is positioned between the plug 150 and the bit line structure 136, and between the plug 150 and the second pad 126, so that the first pad 124 and the plug 150 may be securely insulated from the bit line structure 136 and the second pad 126. As a result, the first pad 124 and the plug 150 may be completely insulated from the second pad 126 and the bit line structure 136 without any electrical shorts among the first pad 124, the bit line structure 136 and the second pad 126, or among the plug 150, the bit line structure 136 and the second pad 126.

The second insulation layer 131 is positioned on the blocking layer pattern 130. The second insulation layer 131 electrically insulates the first pad 124 from the bit line structure 136. The second insulation layer 131 may include an oxide, such as BPSG, PSG, SOG, USG, FOX, TEOS, PE-TEOS, HDP-CVD oxide, etc. The oxide of the second insulation layer 131 may be substantially the same as or similar to that of the first insulation layer 122. Alternatively, the first and the second insulation layers 122 and 131 may include different oxides, respectively.

The bit line structure 136 is positioned on the second insulation layer 131. The bit line structure 136 includes a bit line 132, a bit line mask 134 and a bit line spacer 135. The bit line 132 disposed on the second insulation layer 131 extends through a third contact hole (not illustrated) formed through the second insulation layer 131. The bit line 132 makes contact with the second pad 126. The bit line 132 may include doped polysilicon, a metal, a metal compound, and/or the like. For example, the bit line 132 may include, polysilicon doped with impurities, tungsten, aluminum, titanium, tantalum, copper, tungsten nitride, aluminum nitride, titanium nitride, tantalum nitride, etc., which may be used alone or in various mixtures thereof. In various exemplary embodiments, the bit line 132 may have a single layer structure or a multi-layer structure. For example, the bit line 132 may include a first film including titanium/titanium nitride and a second film including tungsten.

The bit line mask 134 is located on an upper face of the bit line 132. The bit line mask 134 may include a material having an etching selectivity with respect to the third insulation layer 140. For example, the bit line mask 134 may include a nitride, such as silicon nitride, or an oxynitride, such as silicon oxynitride.

The bit line spacer 135 is provided on sidewalls of the bit line 132 and the bit line mask 134. The bit line spacer 135 may include a material that has an etching selectivity relative to the second insulation layer 131 and the third insulation layer 140. For example, the bit line spacer 135 may include an oxynitride, such as silicon oxynitride, or a nitride, such as silicon nitride.

The plug 150 is provided in an opening (not illustrated) formed through the second and third insulation layers 131 and 140. The plug 150 may include doped polysilicon, a metal, a metal nitride and/or the like. For example, the plug 150 may include polysilicon doped with impurities, tungsten, aluminum, titanium, tantalum, copper, aluminum nitride, titanium nitride, titanium aluminum nitride, tantalum nitride, tungsten nitride, etc., which may be used alone or in various mixtures thereof.

In various example embodiments, the plug 150 may have lower and upper portions, where the lower portion is substantially wider than the upper portion. For example, the lower portion may be substantially wider than the upper portion. Thus, the plug 150 may be positioned on the first pad 124 and the blocking layer pattern 130. Since the plug 150 has the wider lower portion, a contact area between the plug 150 and the first pad 124 may be improved, and also the structural stability of the plug 150 may be enhanced.

The spacer 144 is interposed between the plug 150 and the bit line structure 136. Further, the spacer 144 extends to an upper face of the second pad 126. The spacer 144 may include an oxynitride, such as silicon oxynitride, or a nitride, such as silicon nitride. The spacer 144 may enhance the electrical insulations between the plug 150 and the bit line structure 136, and between the plug 150 and the second pad 126. Therefore, the wiring structure having the above-described construction has enhanced structural stability and improved electrical characteristics, while substantially reducing or eliminating the possibility of electrical failure and/or shorts among elements.

FIGS. 2 to 6 are cross-sectional views illustrating the formation of a wiring structure in a semiconductor device, according to example embodiments of the present invention.

Figure 2:
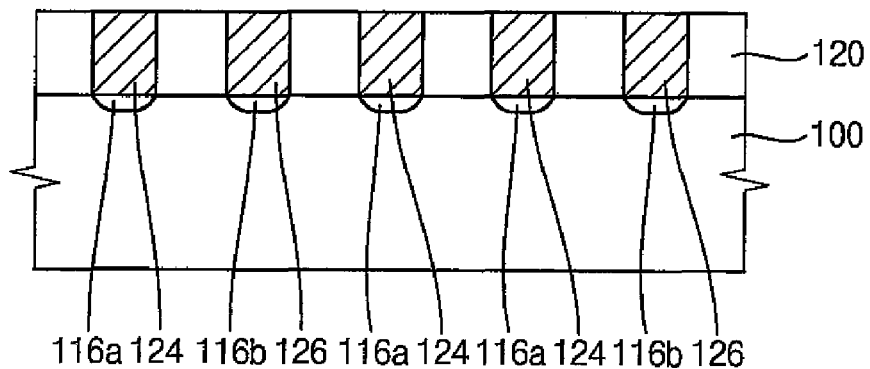
FIGS. 2 to 6 are cross-sectional views illustrating formation of a wiring structure in a semiconductor device, according to example embodiments of the present invention.

Referring to FIG. 2, the first contact region 116a and the second contact region 116b are formed at portions of a substrate 100, and a preliminary first insulation layer 120 is formed on the substrate 100. In various example embodiments, a conductive structure (not illustrated) including a gate structure may be formed on the substrate 100 before forming the preliminary first insulation layer 122.

The preliminary first insulation layer 122 may be formed using an oxide, such as BPSG, PSG, SOG, USG, FOX, TEOS, PE-TEOS, HDP-CVD oxide, etc. Further, the preliminary first insulation layer 122 may be formed by a chemical vapor deposition (CVD) process, a plasma enhanced chemical Vapor deposition (PECVD) process, an atomic layer deposition (ALD) process, a spin coating process, an HDP-CVD process, etc.

After a photoresist pattern (not illustrated) is provided on the preliminary first insulation layer 122, the preliminary first insulation layer 122 is partially etched to form a first contact hole (not illustrated) and a second contact hole (not illustrated) through the first insulation layer 122. The first and the second contact holes expose the first and second contact regions 116a and 116b, respectively. The first and the second contact holes may be formed by an anisotropic etching process, for example. The photoresist pattern is removed from the preliminary first insulation layer 122, for example, using an ashing process and/or a stripping process.

A first conductive layer (not illustrated) is formed on the preliminary first insulation layer 120 to fill the first and the second contact holes. The first conductive layer may be formed using a metal, a metal compound and/or doped polysilicon. For example, the first conductive layer may include polysilicon doped with impurities, tungsten, aluminum, titanium, tantalum, copper, tungsten nitride, aluminum nitride, titanium nitride, tantalum nitride, etc., which may be used alone or various mixtures thereof. Further, the first conductive layer may be formed by a CVD process, an ALD process, a sputtering process, an evaporation process, a pulsed laser deposition (PLD) process, etc. In various example embodiments, the first conductive layer may be formed by doping impurities into a polysilicon layer after depositing the polysilicon layer on the preliminary first insulation layer 120 to fill the first and second contact holes. Alternatively, the impurities may be doped into the polysilicon layer while forming the polysilicon layer.

In various example embodiments, the first conductive layer may have a single layer structure including doped polysilicon, metal and/or metal compound. Alternatively, the first conductive layer may have a multi layer structure that includes a metal film and/or a metal compound film. For example, the first conductive layer may include a titanium nitride film, a titanium film and/or a tungsten film.

Referring to FIG. 2, the first conductive layer is partially removed until the preliminary first insulation layer 120 is exposed, so that a first pad 124 and a second pad 126 are formed in the first contact hole and the second contact hole, respectively. The first pad 124 is positioned on the first contact region 116a, and the second pad 126 is positioned on the second contact region 116b. The first and the second pads 124 and 126 may be formed by a chemical mechanical polishing (CMP) process and/or an etch-back process, for example. Each of the first and the second pads 124 and 126 may have a height substantially the same as or similar to a height of the preliminary first insulation layer 120.

Figure 3:
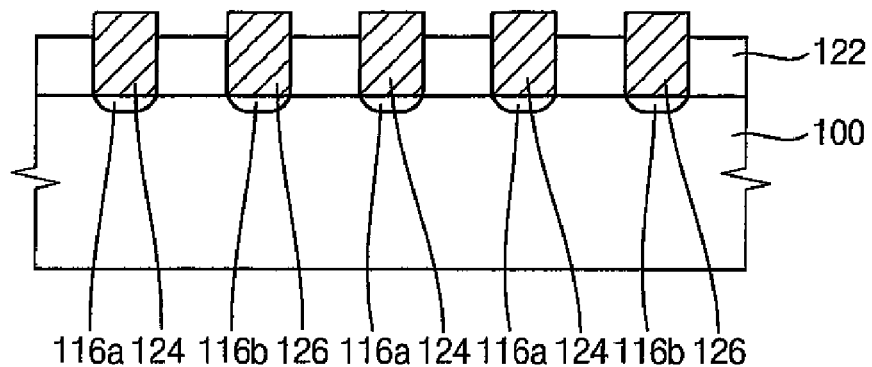

Referring to FIG. 3, an upper portion of the preliminary first insulation layer 120 is removed to provide a first insulation layer 122 on the substrate 100. That is, the preliminary first insulation layer 120 is partially removed so as to form the first insulation layer 122 having a height less than the heights of the first and the second pads 124 and 126. For example, the height of the first insulation layer 122 may be substantially less than the heights of the first and the second pads 124 and 126. The first insulation layer 122 may be formed, for example, by a wet etching process or a dry etching process. After forming the first insulation layer 122, upper portions of the first and the second pads 124 and 126 may protrude from the first insulation layer 122.

Figure 4:
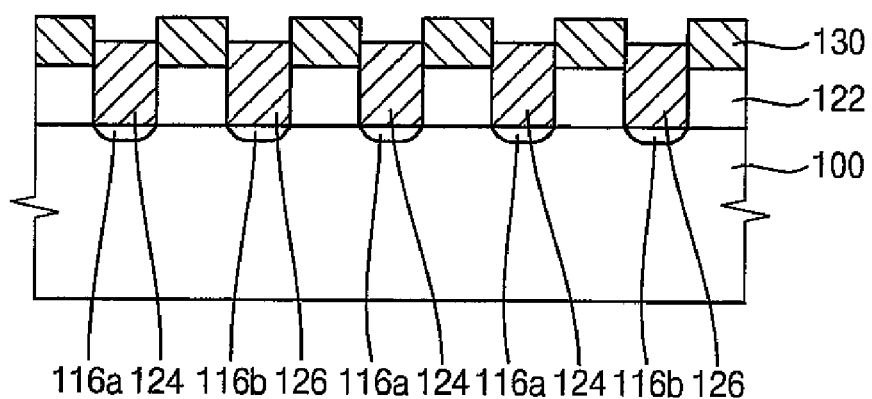

Referring to FIG. 4, a blocking layer (not illustrated) is formed on the first insulation layer 122, the first pad 124 and the second pad 126. The blocking layer may be formed using a material that has an etching selectivity with respect to the first insulation layer 122, the first pad 124 and the second pad 126. For example, the blocking layer may be formed using a nitride, such as silicon nitride, or an oxynitride, such as silicon oxynitride or titanium oxynitride. Further, the blocking layer may be formed by a CVD process, a low pressure chemical vapor deposition (LPCVD) process, a PECVD process, etc.

In various example embodiments, the blocking layer has a thickness larger than a height difference between the first insulation layer 122 and the first pad 124 or between the first insulation layer 122 and the second pad 126. This thickness may be substantially larger than the height differences between the first insulation layer 122 and the first pad 124 or between the first insulation layer 122 and the second pad 126. For example, the thickness of the blocking layer may be about 1.5 times larger than the height difference between the first insulation layer 122 and the pads 124 and 126.

After a photoresist pattern (not illustrated) is formed on the blocking layer, the blocking layer is partially etched using the photoresist pattern as an etching mask. Accordingly, the blocking layer pattern 130 is formed on the first insulation layer 122 between the first pad 124 and the second pad 126. Since the blocking layer pattern 130 has an upper face substantially higher than upper faces of the first and the second pads 124 and 126, the blocking layer pattern 130 protrudes between the first pad 124 and the second pad 126. After forming the blocking layer pattern 130, the photoresist pattern may be removed by an ashing process and/or a stripping process, for example.

In various example embodiments, upper portions of the first and second pads 124 and 126 may be partially etched, so that the blocking layer pattern 130 may have the upper face considerably higher than the upper faces of the first and the second pads 124 and 126. Thus, the first pad 124 may be securely insulated from the second pad 126.

Figure 5:
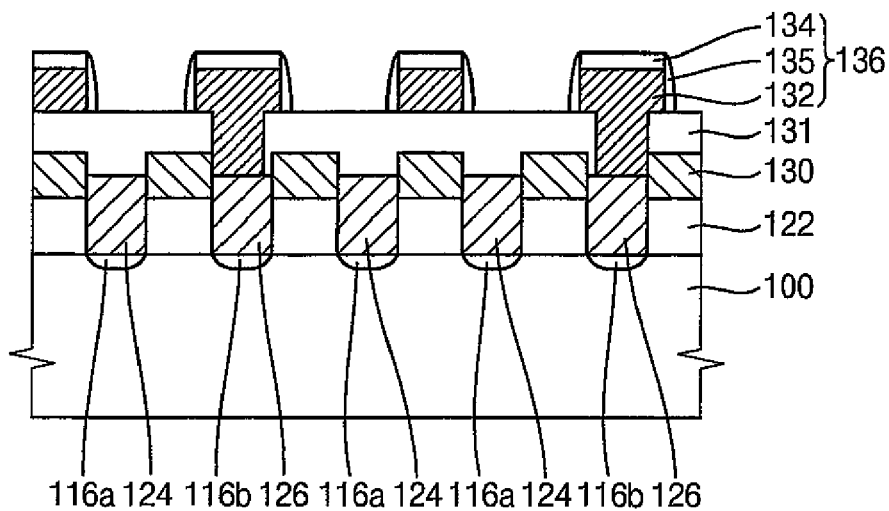

Referring to FIG. 5, a second insulation layer 131 is formed on the blocking layer pattern 130, the first pad 124 and the second pad 126. The second insulation layer 131 electrically insulates the first pad 124 from a bit line 132 formed on the second pad 126. The second insulation layer 131 may be formed using an oxide, such as BPSG, PSG, SOG, USG, FOX, TEOS, PE-TEOS, HDP-CVD oxide, etc. Further, the second insulation layer 131 may be formed by a CVD process, a PECVD process, a spin coating process, an HDP-CVD process, etc. In various example embodiments, the oxide of the second insulation layer 131 may be substantially the same or similar to that of the first insulation layer 122. Alternatively, the first insulation layer 122 may include an oxide different from that of the second insulation layer 131.

In various example embodiments, the second insulation layer 131 may be planarized to provide a level upper face. For example, an upper portion of the second insulation layer 131 may be planarized by a CMP process and/or an etch-back process, so that the second insulation layer 131 has a flat upper face.

A photoresist pattern (not illustrated) is provided on the second insulation layer 131, and the second insulation layer 131 is partially etched using the photoresist pattern as an etching mask to form a third contact hole (not illustrated) that partially exposes the second pad 126. The third contact hole may be formed by an anisotropic etching process, for example. In various example embodiments, the third contact hole has a width smaller than a width of the second pad 126. For example, the width of the third contact hole may be substantially smaller than the width of the second pad 126. Thus, an upper peripheral portion of the second pad 126 may not be exposed through the third contact hole. The photoresist pattern may be removed by an ashing process and/or a stripping process, for example, after forming the third contact hole.

A second conductive layer (not illustrated) is formed on the second insulation layer 131 to fill the third contact hole. The second conductive layer may be formed using a metal, a metal compound and/or doped polysilicon. For example, the second conductive layer may be formed using polysilicon doped with impurities, tungsten, aluminum, titanium, tantalum, copper, tungsten nitride, aluminum nitride, titanium nitride, tantalum nitride, etc., which may be used alone or in various mixtures thereof. Additionally, the second conductive layer may be formed by a CVD process, an ALD process, a sputtering process, an evaporation process, a PLD process, etc. The second conductive layer may have a single layer structure or a multi-layer structure. For example, the second conductive layer may have a first film including titanium/titanium nitride and a second film including tungsten.

A bit line mask 134 is formed on the second conductive layer. The bit line mask 134 may be formed using a nitride, such as silicon nitride, or an oxynitride, such as silicon oxynitride. The second conductive layer is partially etched using the bit line mask 134 as an etching mask. Thus, the bit line 132 filling the third contact hole is formed on the second insulation layer 131. The bit line 132 makes electrical contact with the second contact region 116b through the second pad 126. Since the third contact hole may be substantially narrower than the second pad 126, the lower portion of the bit line 132 may have a width substantially smaller than the width of the second pad 126.

A bit line spacer formation layer (not illustrated) is formed on the second insulation layer 131 to cover the bit line 132 and the bit line mask 134, and then the bit line spacer formation layer is partially etched to form the bit line spacer 135 on sidewalls of the bit line 132 and the bit line mask 134. The bit line spacer 135 may be formed, for example, by an anisotropic etching process. Further, the bit line spacer 135 may include a nitride, such as silicon nitride, or an oxynitride, such as silicon oxynitride. As a result, a bit line structure 136 is provided on the second insulation layer 131 and the second pad 126. The bit line structure 136 includes the bit line 132, the bit line mask 134 and the bit line spacer 135.

In various example embodiments, a metal layer (not illustrated) may be formed on the second pad 126 and a sidewall of the third contact hole before forming the bit line 132. The metal layer may be formed, for example, using titanium, tungsten, tantalum, cobalt, etc., by a CVD process, an ALD process, a sputtering process, a PLD process, an evaporation process, etc. When the bit line 132 includes doped polysilicon, for example, a silicidation process may be performed after forming the bit line 132 on the metal layer. Hence, a metal silicide layer may be formed between the second pad 126 and the bit line 132 in accordance with a reaction between metal in the metal layer and silicon in the bit line 132. For example, the metal silicide layer may include titanium silicide (TiSix), tungsten silicide (WSix), tantalum silicide (TaSix), cobalt silicide (CoSix), etc. This metal silicide layer may reduce a contact resistance between the second pad 126 and the bit line 132. Therefore, the wiring structure including the metal silicide layer has improved electrical characteristics.

Figure 6:
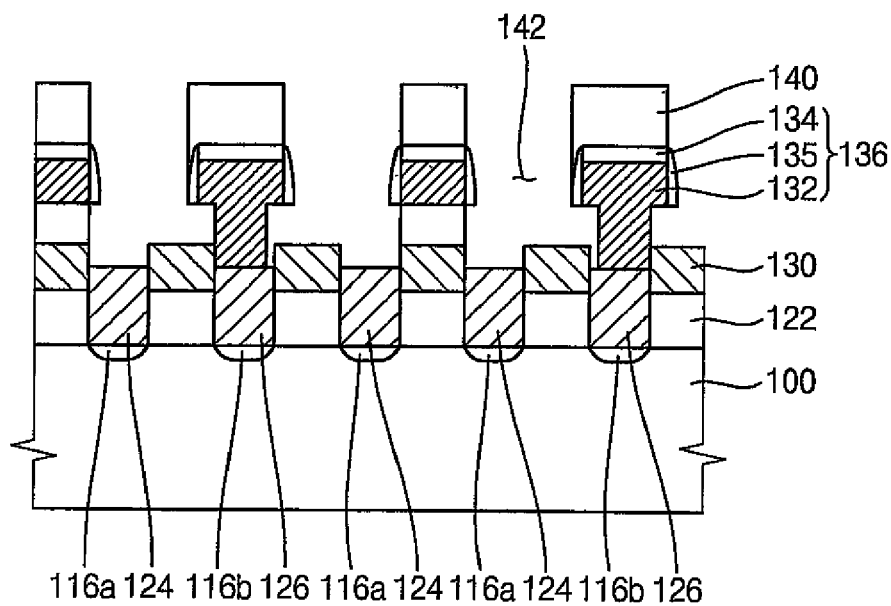

Referring to FIG. 6, a third insulation layer 140 is formed on the second insulation layer 131 to cover the bit line structure 136. The third insulation layer 140 may be formed by a CVD process, a PECVD process, a spin coating process, an HDP-CVD process, etc. Further, the third insulation layer 140 may be formed using an oxide, such as silicon oxide. For example, the third insulation layer 140 may include BPSG, PSG, SOG, USG, FOX, TEOS, PE-TEOS, HDP-CVD oxide, etc. In various example embodiments, the oxide of the third insulation layer 140 may be substantially the same as or similar to that of the second insulation layer 131 and/or that of the first insulation layer 122. Alternatively, the third insulation layer 140 may include an oxide different from that of the second insulation layer 131 and/or that of the first insulation layer 122.

In various example embodiments, the third insulation layer 140 may be planarized by a planarization process. For example, an upper portion of the third insulation layer 140 may be planarized by a CMP process and/or an etch-back process, so that the third insulation layer 140 has a level upper face.

After a photoresist pattern (not illustrated) is provided on the third insulation layer 140, the third insulation layer 140 and the second insulation layer 131 are partially etched to form an opening 142 through the second and the third insulation layers 131 and 140. The opening 142 may be formed by an anisotropic etching process, for example. The opening 142 exposes the first pad 124, the blocking layer pattern 130 and the bit line spacer 135. Further, the opening 142 exposes a sidewall of the lower portion of the bit line 132 because the lower portion of the bit line 132 has the width smaller than the width of the second pad 126 as described above. Here, an upper portion of the second pad 126 and an upper sidewall of the blocking layer pattern 130 may be partially exposed through the opening 142. Therefore, the opening 142 may have different lower and upper widths, where the lower width is larger than the upper width. The lower width may be substantially larger than the upper width. In various example embodiments, the opening 142 may be formed by a self-alignment process with respect to the bit line structure 136.

A spacer formation layer (not illustrated) is formed on the first pad 124, the blocking layer pattern 130, a sidewall of the opening 142 and the third insulation layer 140. The spacer formation layer may be formed using a nitride, such as silicon nitride, or an oxynitride, such as silicon oxynitride, for example. The spacer formation layer is partially etched to form a spacer 144 on the sidewall of the opening 142, as illustrated in FIG. 1. The spacer 144 may be formed by an anisotropic etching process, for example. In various example embodiments, the spacer 144 covers the exposed portion of the second pad 126, the lower portion of the bit line 132, the upper sidewall of the blocking layer pattern 130 and the bit line spacer 135. That is, the spacer 144 may be continuously formed from the third insulation layer 140 to the second pad 126 through a sidewall of the bit line structure 136. Accordingly, the second pad 126 and the lower portion of the bit line 132 are not exposed because of the spacer 144.

A third conductive layer (not illustrated) is formed on the third insulation layer 140 to fill the opening 142. The third conductive layer may be formed using doped polysilicon, a metal and/or a metal compound. For example, the third conductive layer may include polysilicon doped with impurities, tungsten, aluminum, titanium, tantalum, copper, aluminum nitride, titanium nitride, titanium aluminum nitride, tantalum nitride, tungsten nitride, etc., which may be used alone or in various mixtures thereof. The third conductive layer may be formed by a sputtering process, a CVD process, an ALD process, an evaporation process, a PLD process, etc.

The third conductive layer may be partially removed until the third insulation layer 140 is exposed, so that a plug 150 is formed in the opening 142, as illustrated in FIG. 1. The plug 150 may be formed by a CMP process and/or an etch-back process, for example. The plug 150 is positioned on the first pad 124 and the blocking layer pattern 130. Thus, the plug 150 makes electrical contact with the first contact region 116a through the first pad 124. However, the plug 150 is electrically insulated from the bit line 132 and the second pad 126 because the spacer 144 covers the second pad 126 and the bit line 132.

In various example embodiments, the plug 150 may have lower and upper portions, where the lower portion is wider than the upper portion in accordance with a shape of the opening 142. Hence, the plug 150 may make stable contact with the first pad 124, preventing or reducing the possibility of electrical failure. The lower portion of the plug 150 may be substantially wider than the upper portion. Furthermore, the plug 150 is electrically insulated from the second pad 126 and the bit line structure 136 because of the spacer 144 and the blocking layer pattern 130, thus preventing or reducing the possibility of an electrical short between the plug 150 and the second pad 126 and/or between the plug 150 and the bit line structure 136. As a result, the wiring structure including the plug 150 has improved electrical characteristics, without electrical failure.

FIGS. 7 to 15 are cross-sectional views illustrating the fabrication process of a semiconductor having a wiring structure, according to example embodiments of the present invention.

Figure 7:
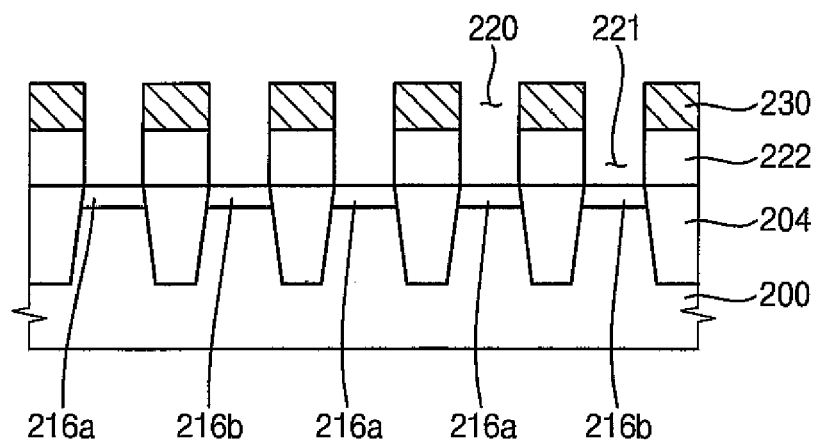
FIGS. 7 to 15 are cross-sectional views illustrating manufacturing of a semiconductor device including a wiring structure, according to example embodiments of the present invention.

Referring to FIG. 7, an isolation layer 204 is formed on a substrate 200, so that the substrate 200 is divided into an active region and a field region. The isolation layer 204 may be formed using oxide by a thermal oxidation process or an STI process, for example.

A gate structure (not illustrated) is formed on the active region of the substrate 200. The gate structure may include a gate insulation layer pattern, a gate electrode and a gate mask sequentially formed on the substrate 200. In various example embodiments, a gate spacer may be provided on a sidewall of the gate structure.

Using the gate structure as an implantation mask, a first contact region 216a and a second contact region 216b are formed at portions of the substrate 200 adjacent to the gate structure. The first and the second contact regions 216a and 216b may be formed by an ion implantation process, for example. As a result, a transistor including the gate structure, the first contact region 216a and the second contact region 216b is provided on the substrate 200. In various example embodiments, the first contact region 216a may correspond to a capacitor contact region to which a capacitor (not illustrated) is electrically connected. Further, the second contact region 216b may correspond to a bit line contact region to which a bit line structure 236 (see FIG. 9) is electrically connected.

A first insulation layer 222 is formed on the substrate 200 to cover the gate structure. The first insulation layer 222 may be formed, for example, using oxide by a CVD process, a PECVD process, a spin coating process, an HDP-CVD process, etc.

After a blocking layer (not illustrated) is formed on the first insulation layer 222, the blocking layer is etched to provide a blocking layer pattern 230 on the first insulation layer 222. The blocking layer pattern 230 may be formed, for example, using nitride or oxynitride by a CVD process, a PECVD process, an LPCVD process, etc. The blocking layer pattern 230 is positioned on a portion of the first insulation layer 222 between the first contact region 216a and the second contact region 216b. In various example embodiments, the blocking layer pattern 230 may have a thickness above about 500 Å based on an upper face of the first insulation layer 222.

Using the blocking layer pattern 230 as an etching mask, the first insulation layer 222 is partially etched to form a first contact hole 220 and a second contact hole 221 through the first insulation layer 222. That is, portions of the first insulation layer 222 exposed by the blocking layer pattern 230 are etched to provide the first and the second contact holes 220 and 221. The first and the second contact holes 220 and 221 expose the first and the second contact regions 216a and 216b, respectively. In various example embodiments, the first and second contact holes 220 and 221 may be formed, for example, by a self-alignment process with respect to the gate spacer of the transistor.

Figure 8:
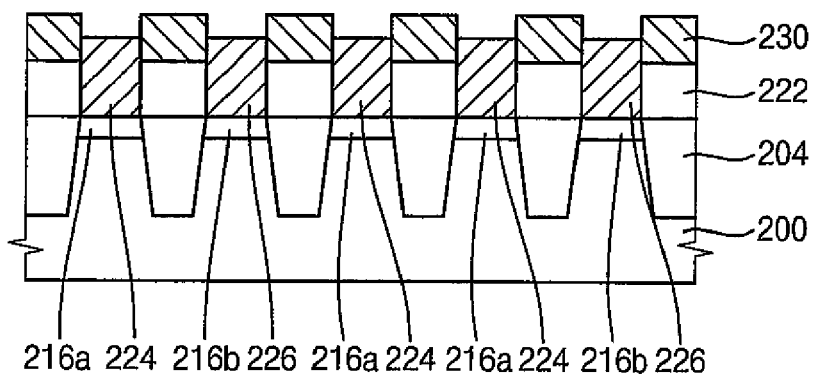

Referring to FIG. 8, a first pad 224 is formed on the first contact region 216a to fill up the first contact hole 220. A second pad 226 filling the second contact hole 221 is formed on the second contact region 216b, which may be formed simultaneously with forming the first pad 224. Each of the first and the second pads 224 and 226 may be formed, for example, using doped polysilicon, metal and/or metal compound by a sputtering process, a CVD process, an ALD process, a PLD process, an evaporation process, etc. Each of the first pad 224 and the second pad 226 may have a height lower than a height of the blocking layer pattern 230. The heights of the first and the second pads 224 and 226 may be substantially lower than the height of the blocking layer pattern 230. However, the first and the second pads 224 and 226 are substantially higher than the first insulation layer 222, and may be substantially higher than the first insulation layer 222.

In various example embodiments, a doped polysilicon layer (not illustrated) may be formed on the blocking layer pattern 230 to fill the first and second contact holes 220 and 221. The doped polysilicon layer may be removed until the blocking layer pattern 230 is exposed, so that a preliminary first pad (not illustrated) and a preliminary second pad (not illustrated) are formed in the first contact hole 220 and the second contact hole 221, respectively. Here, each of the preliminary first pad and the preliminary second pad may have a height substantially the same as that of the blocking layer pattern 230. The preliminary first pad and the preliminary second pad may be partially etched to form the first pad 224 and the second pad 226 on the substrate 200.

Figure 9:
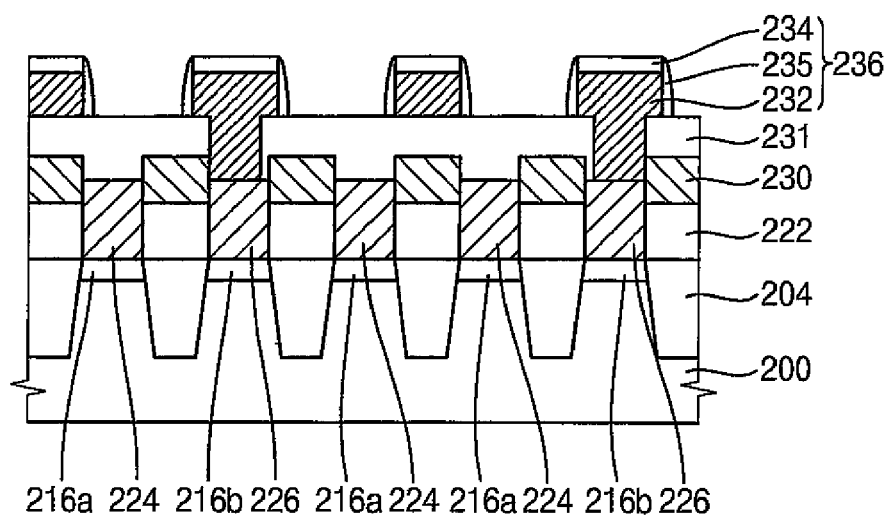

Referring to FIG. 9, a second insulation layer 231 is formed on the blocking layer pattern 230, the first pad 224 and the second pad 226. The second insulation layer 231 may be formed, for example, using oxide by a CVD process, a PECVD process, a spin coating process, a HDP-CVD process, etc.

The second insulation layer 231 is partially etched to form a third contact hole (not illustrated) that exposes the second pad 226. The third contact hole may be formed by an anisotropic etching process, for example. In various example embodiments, a portion of the second pad 226 is not exposed through the third contact hole. For example, the third contact hole may have a width smaller than a width of the second pad 226.

After a bit line conductive layer (not illustrated) is formed on the second insulation layer 231 to fill the third contact hole, the bit line conductive layer is etched to form a bit line 232 making contact with the second pad 226 on the second insulation layer 231. When the third contact has the width smaller than that of the second pad 226, a lower portion of the bit line 232 may also have a width smaller than the width of the second pad 226.

A bit line mask 234 is formed on the bit line 232, and then a bit line spacer 235 is formed on sidewalls of the bit line 232 and the bit line mask 234, providing the bit line structure 236 on the second insulation layer 231. Each of the bit line mask 234 and the bit line spacer 235 may be formed using nitride or oxynitride having an etching selectivity relative to an oxide layer, for example.

Figure 10:
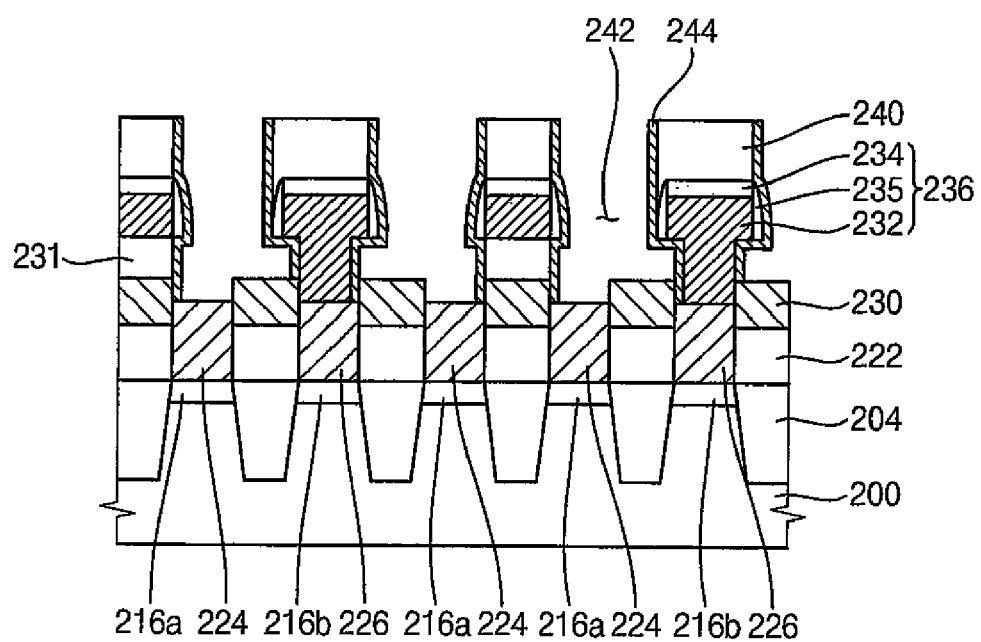

Referring to FIG. 10, a third insulation layer 240 is formed on the second insulation layer 231 to sufficiently cover the bit line structure 236. The third insulation layer 240 may be formed, for example, using oxide by a CVD process, a PECVD process, a spin coating process, an HDP-CVD process, etc. The third and second insulation layers 240 and 231 are sequentially etched to form an opening 242 that exposes the first pad 224, the blocking layer pattern 230, and at least a portion of the second pad 226. In various example embodiments, the opening 242 has a lower portion wider than an upper portion. For example, the lower portion of the opening 242 may be substantially wider than the upper portion. Thus, the opening 242 exposes a sidewall of the bit line structure 236, as well as the lower portion of the bit line 232.

A spacer 244 is formed on a sidewall of the opening 242, on the blocking layer pattern 230, the first pad 224 and the exposed portion of the second pad 226. The spacer 244 may be formed using nitride or oxynitride, for example. In various exemplary embodiments, the spacer 244 may be formed on the lower portion of the bit line 232 exposed by the opening 242.

Figure 11:
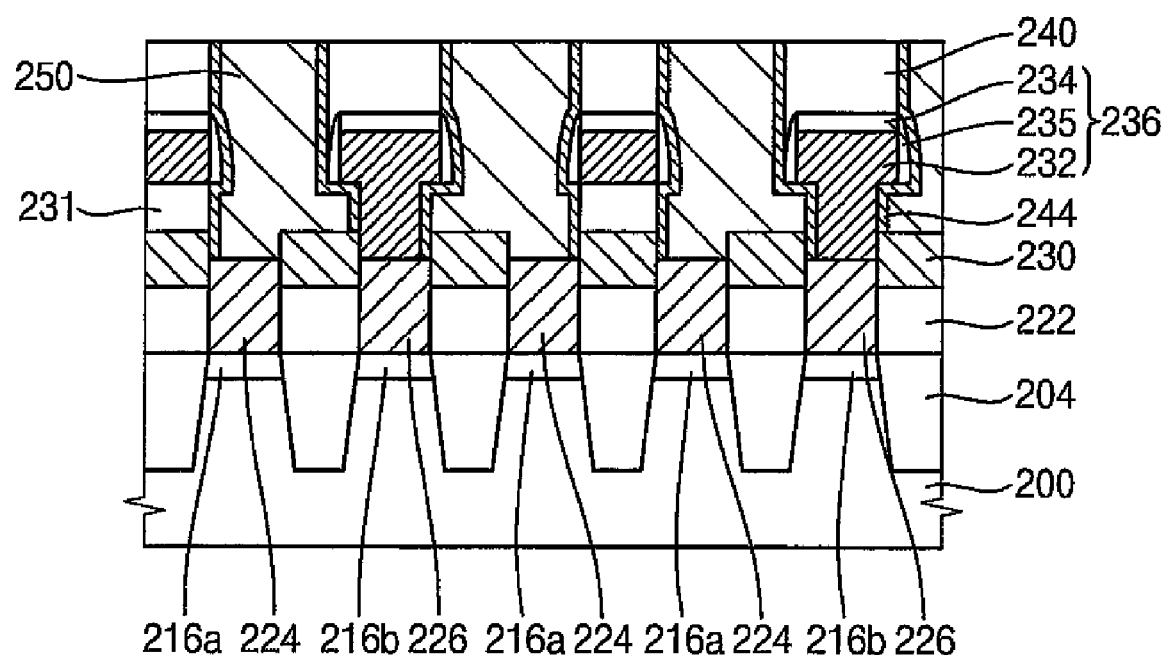

Referring to FIG. 11, a conductive layer (not illustrated) is formed on the third insulation layer 240 to fill the opening 242. The conductive layer may be formed, for example, using doped polysilicon, metal and/or metal compound by a sputtering process, a CVD process, an ALD process, a PLD process, an evaporation process, etc. The conductive layer is removed until the third insulation layer 240 is exposed to form a plug 250 in the opening 242. The plug 250 is located on the first pad 224 and the blocking layer pattern 230. When the opening 242 has a lower width larger than an upper width, the plug 250 may likewise have a lower portion wider than an upper portion. The spacer 244 is interposed between the plug 250 and the bit line structure 236, and between the plug 250 and the second pad 226.

Figure 12:
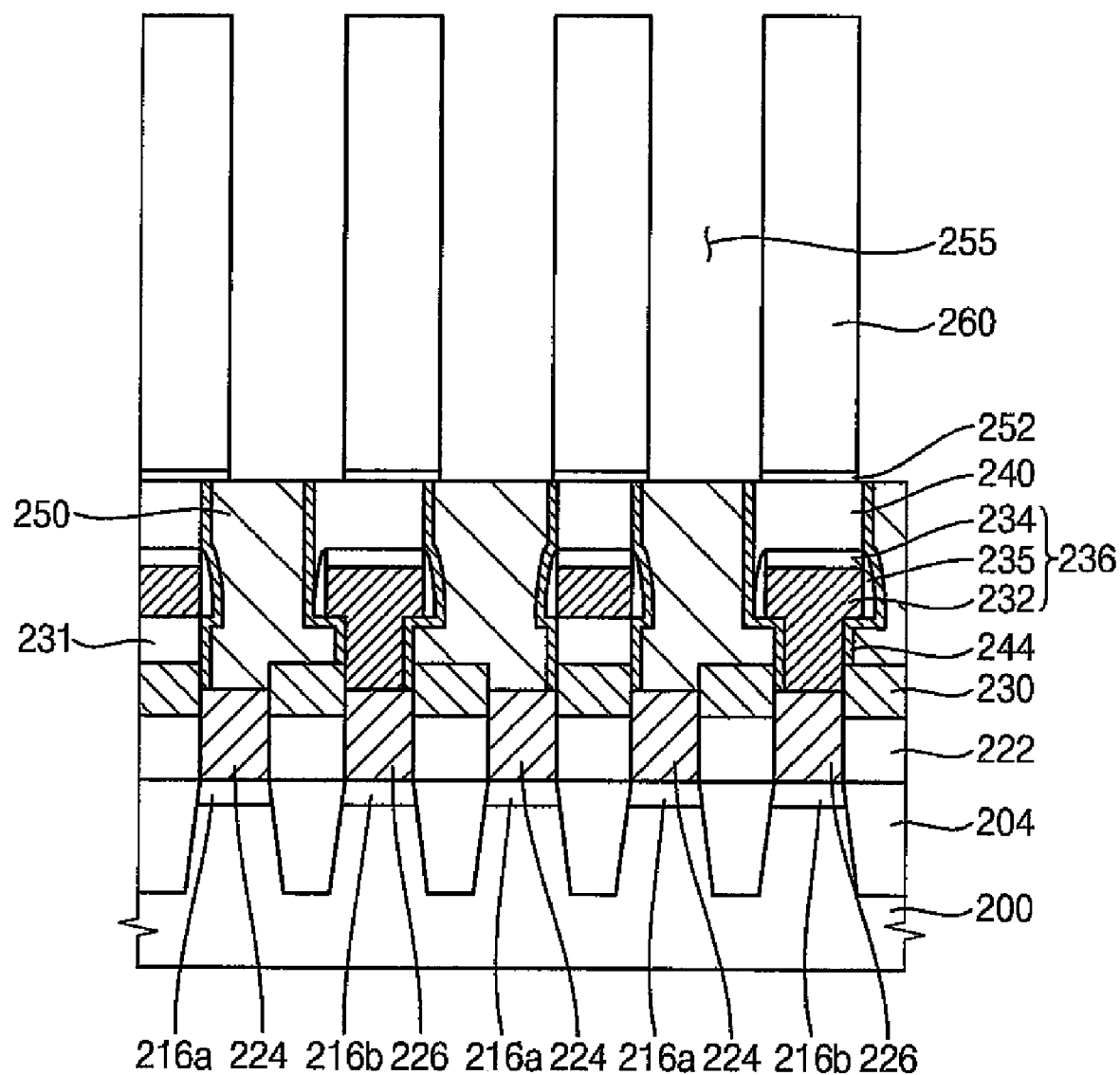

Referring to FIG. 12, an etch stop layer 252 and a mold layer 260 are successively formed on the third insulation layer 240. The etch stop layer 252 may be formed, for example, using a nitride, such as silicon nitride, or a metal oxide, such as hafnium oxide, aluminum oxide, etc. The etch stop layer 252 protects the underlying structure in a successive etching process. The etch stop layer 252 may have a relatively thin thickness of about 10 Å to about 200 Å.

The mold layer 260 may be formed, for example, using an oxide such as USG, SOG, PBSG, PSG, TEOS, PE-TEOS, HDP-CVD oxide, etc. Further, the mold layer 260 may be formed, for example, by a CVD process, a PECVD process, an HDP-CVD process, etc. The mold layer 260 may have a single layer structure or a multi-layer structure. In various example embodiments, the mold layer 260 may include more than two oxide films having etching rates substantially different from each other. The height of the mold layer 260 may vary in accordance with a desired capacitance of the capacitor, since the capacitance of the capacitor may depend on the height of the mold layer 260.

The mold layer 260 and the etch stop layer 252 are successively partially etched to form a hole 255 that exposes the plug 250. Alternatively, the etch stop layer 252 may be etched after etching the mold layer 260. In various example embodiments, the etch stop layer 252 may be somewhat excessively etched to sufficiently expose an upper face of the plug 250 through the hole 255.

Figure 13:
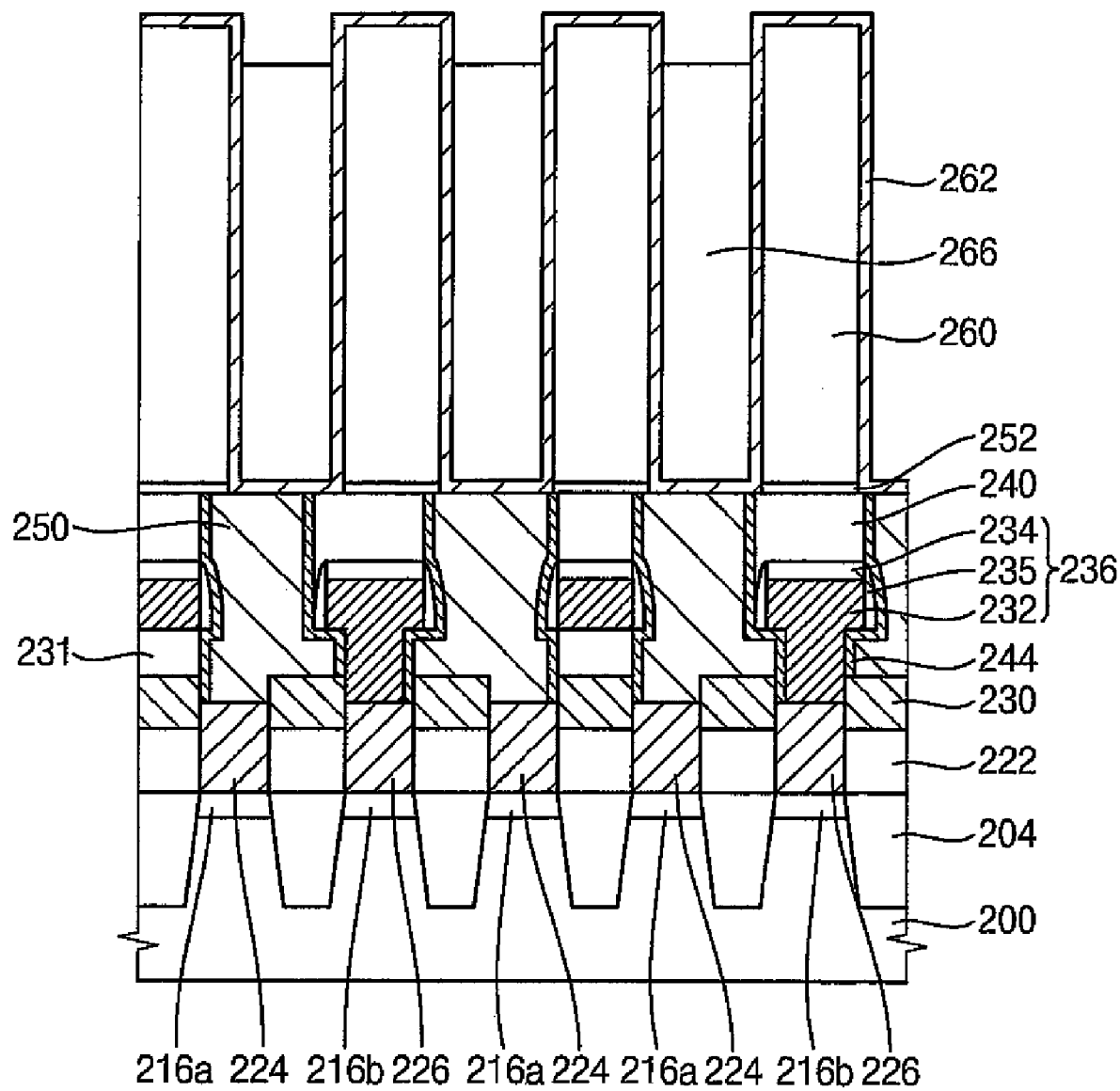

Referring to FIG. 13, a lower electrode layer 262 is formed on the plug 250, sidewalls of the hole 255 and the mold layer 260. The lower electrode layer 262 may be formed, for example, using doped polysilicon, metal and/or metal compound by a sputtering process, a CVD process, a cyclic CVD process, an ALD process, an evaporation process, a PLD process, etc. In various exemplary embodiments, the lower electrode layer 262 may have a single layer structure or a multi-layer structure. For example, the lower electrode layer 262 may include a titanium film and a titanium nitride film. When the lower electrode layer 262 includes metal and/or metal compound, a depletion layer may not be generated between a lower electrode 270 (see FIG. 14) and a dielectric layer 280 (see FIG. 15). Thus, the capacitor may have an improved capacitance.

A buffer layer pattern 266 is formed on the lower electrode layer 262, filling the hole 255. The buffer layer pattern 266 may be formed, for example, using polysilicon or an oxide, such as silicon oxide, by a CVD process, a PECVD process, an LPCVD process, an HDP-CVDD process, etc. The buffer layer pattern 266 protects the lower electrode 270 in successive etching processes. In various example embodiments, the buffer layer pattern 266 may partially fill the hole 255.

Figure 14:
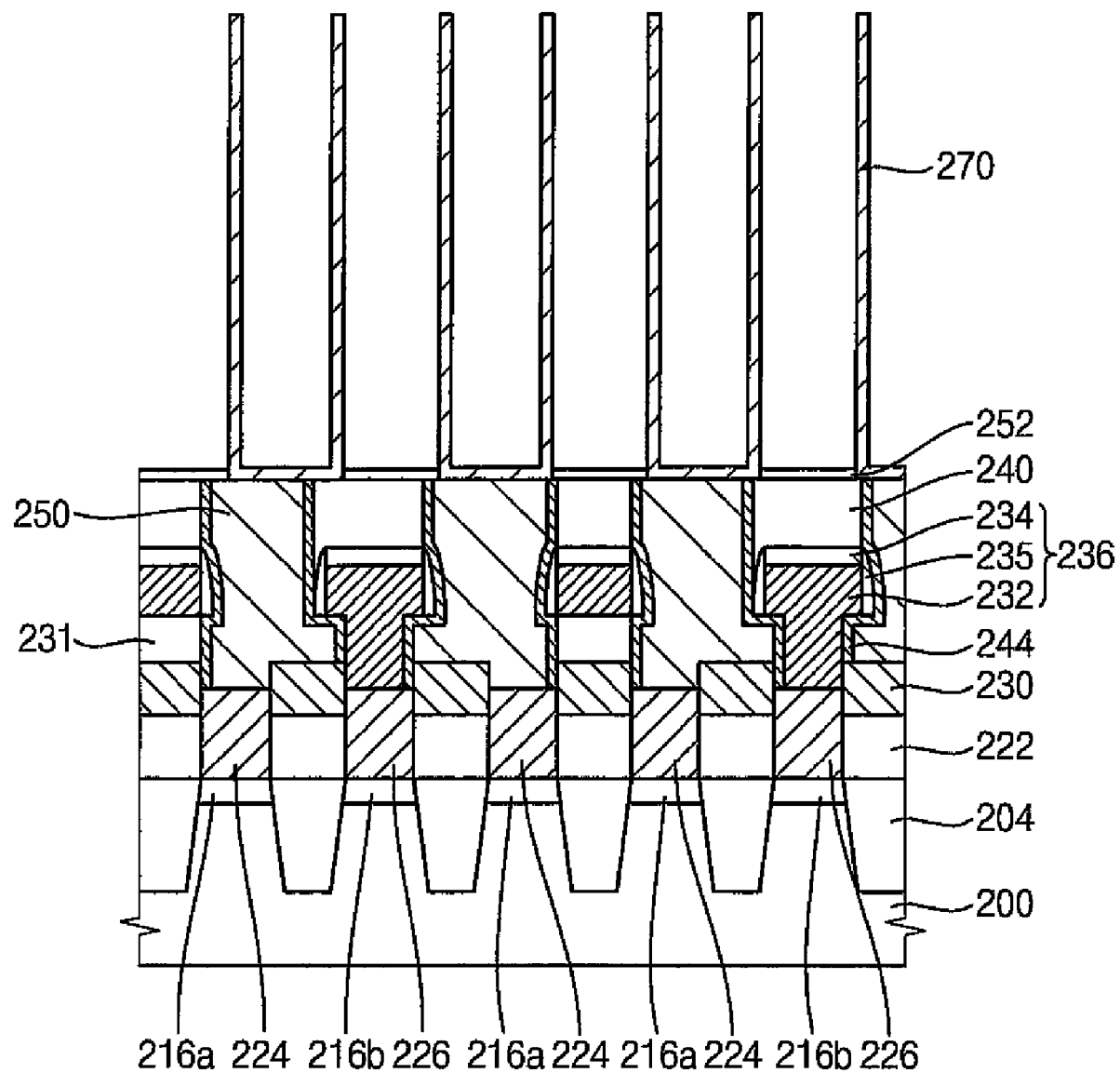

Referring to FIG. 14, the lower electrode layer 262 positioned on the mold layer 260 is removed to provide the lower electrode 270 on the plug 250. The lower electrode layer 262 may be partially removed by a CMP process and/or an etch-back process, for example. When the mold layer 260 and the buffer layer pattern 266 are removed from the lower electrode 270, the lower electrode 270 is formed to have a cylindrical structure on the plug 250. In various example embodiments, the mold layer 260 and the buffer layer pattern 266 may be removed using a limulus amoebocyte lysate (LAL) solution including deionized water, a hydrogen fluoride solution and an ammonia fluoride solution, when the mold layer 260 and the buffer layer pattern 266 include oxides, respectively.

Figure 15:
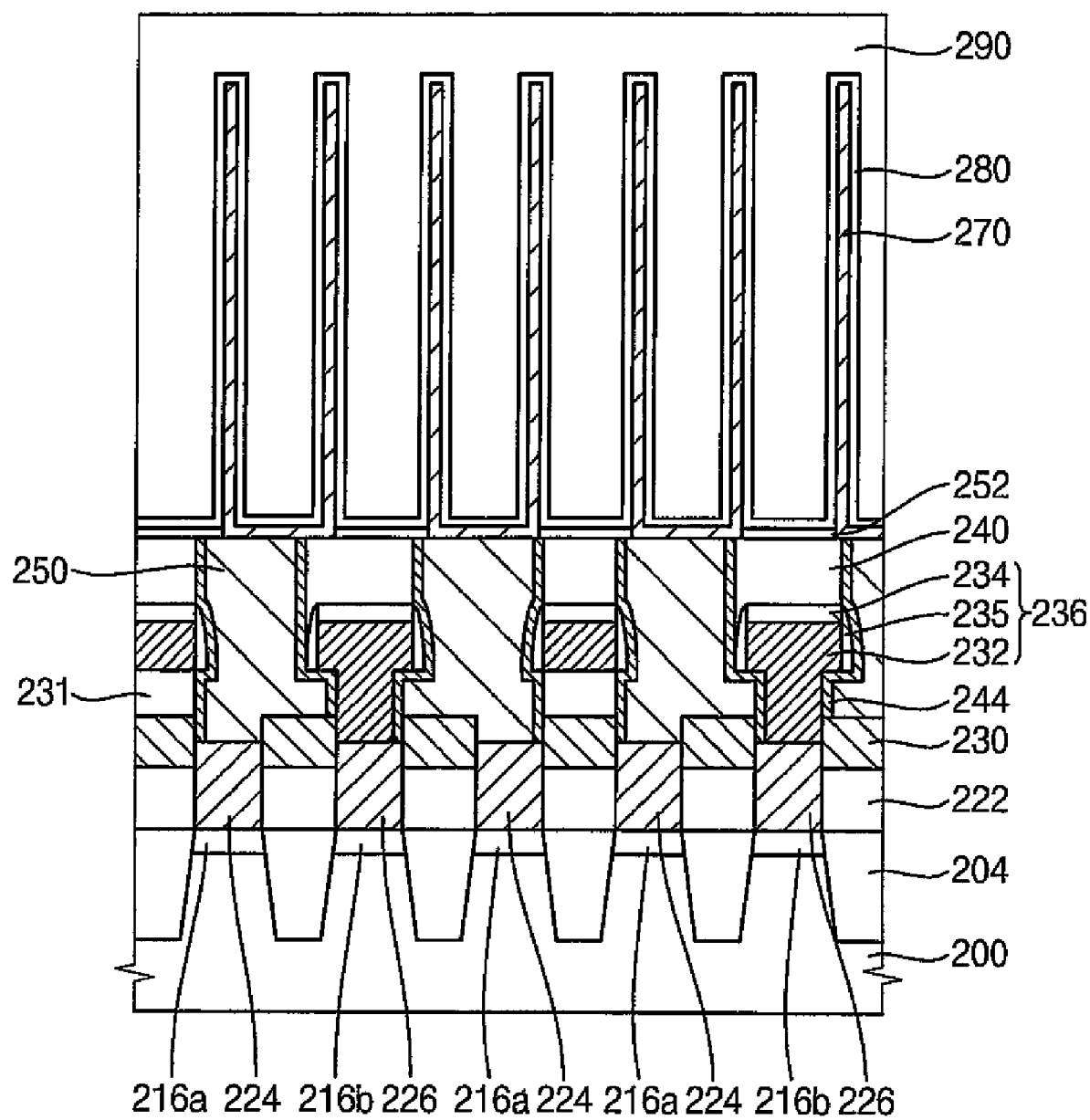

Referring to FIG. 15, the dielectric layer 280 is formed on the lower electrode 270. The dielectric layer 280 may be formed, for example, using a material having a high dielectric constant. For example, the dielectric layer 280 may include a metal oxide, such as hafnium oxide, zirconium oxide, aluminum oxide, etc.

An upper electrode 290 is formed on the dielectric layer 280. The upper electrode 290 may be formed, for example, using doped polysilicon, metal and/or metal compound. In various example embodiments, the upper electrode 290 may have a single layer structure or a multi layer structure. For example, the upper electrode layer 290 may include a metal film and a polysilicon film or a metal compound film and a polysilicon film.

According to various example embodiments of the present invention, a wiring structure may include a first pad and a second pad substantially higher than a first insulation layer, and a blocking layer pattern substantially higher than the first and the second pads. Further, the wiring structure may include a plug on the first pad, a bit line structure on the second pad, and a spacer positioned between the plug and the bit line structure. Since the plug is effectively insulated from the bit line and the second pad by the spacer, and the first pad may be completely insulated from the second pad by the blocking layer pattern and the spacer, the wiring structure may have improved electrical characteristics, without electrical failures or shorts. Additionally, because the plug may have a lower portion larger than an upper portion, the wiring structure may have enhanced structural stability. When the wiring structure is incorporated into a semiconductor device, the semiconductor device may also have improved electrical characteristics and reliability.

The foregoing is illustrative of the present invention and is not to be construed as limiting thereof. While the present invention has been described with reference to exemplary embodiments, it will be apparent to those skilled in the art that various changes and modifications may be made without departing from the spirit and scope of the present invention. In the claims, any means-plus-function clauses are intended to cover structures described herein as performing the recited function and not only structural equivalents but also equivalent structures. Therefore, it should be understood that the above embodiments are not limiting, but illustrative.

What is claimed is:

1. A method of fabricating a wiring structure in a semiconductor device, the method comprising:
   forming a first insulation layer on a substrate having a first contact region and a second contact region;
   forming a first pad and a second pad on the first contact region and the second contact region, respectively, the first and the second pads being higher than the first insulation layer;
   forming a blocking layer pattern on the first insulation layer between the first pad and the second pad, the blocking layer pattern being higher than the first pad and the second pad;
   forming a second insulation layer on the blocking layer pattern, the first pad and the second pad;
   forming an opening by partially etching the second insulation layer to expose the first pad and the blocking layer pattern;
   forming a spacer on a sidewall of the opening; and
   forming a plug on the first pad to fill the opening,
   wherein forming the first insulation layer and forming the first and the second pads comprise:
      forming a preliminary first insulation layer on the substrate;
      partially etching the preliminary first insulation layer to form contact holes exposing the first and the second contact regions;
      forming the first and the second pads in the contact holes, respectively; and
      partially removing the preliminary first insulation layer to form the first insulation layer.

2. The method of claim 1, wherein forming the first and the second pads comprises:
   forming a conductive layer on the preliminary first insulation layer to fill the contact holes; and
   removing the conductive layer until the preliminary first insulation layer is exposed.

3. The method of claim 1, wherein partially removing the preliminary first insulation layer includes a wet etching process or a dry etching process.

4. The method of claim 1, wherein forming the blocking layer pattern comprises:
   forming a blocking layer on the first insulation layer, the first pad and the second pad; and
   partially etching the blocking layer.

5. The method of claim 4, wherein the blocking layer is formed using a material that has an etching selectivity with respect to at least one of the first insulation layer, the second insulation layer and the third insulation layer.

6. The method of claim 4, further comprising:
   forming a bit line structure on the second insulation layer before forming the opening.

7. The method of claim 6, wherein forming the bit line structure comprises:
   forming a contact hole by partially etching the second insulation layer to expose the second pad;
   forming a bit line on the second insulation layer to fill the contact hole;
   forming a bit line mask on the bit line; and
   forming a bit line spacer on sidewalls of the bit line and the bit line mask.

8. The method of claim 7, wherein the opening further exposes a portion of the second pad, and the spacer extends on the exposed portion of the second pad.

9. A method of manufacturing a semiconductor device, comprising:
   forming a conductive structure on a substrate, the conductive structure including a first contact region and a second contact region formed on the substrate;
   forming a first insulation layer on the substrate to cover the conductive structure;
   forming a blocking layer pattern on the first insulation layer;
   forming a first contact hole and a second contact hole through the first insulation layer using the blocking layer pattern to expose the first contact region and the second contact region, respectively;
   forming a first pad and a second pad in the first contact hole and the second contact hole, respectively, the first and the second pads being higher than the first insulation layer, and lower than the blocking layer pattern;
   forming a second insulation layer on the blocking layer pattern, the first pad and the second pad;
   forming a third contact hole by partially etching the second insulation layer to expose the second pad;
   forming a bit line structure on the second insulation layer to fill the third contact hole;
   forming a third insulation layer on the second insulation layer to cover the bit line structure;
   forming an opening by partially etching the third insulation layer and the second insulation layer to expose the first pad and the blocking layer pattern;
   forming a spacer on a sidewall of the opening; and
   forming a plug on the first pad to fill the opening.

10. The method of claim 9, wherein forming the opening comprises exposing a portion of the second pad.

11. The method of claim 10, wherein the opening comprises a lower width larger than an upper width.

12. The method of claim 10, wherein the spacer is formed between the plug and the bit line structure and extends to the exposed portion of the second pad.

13. The method of claim 9, wherein forming the bit line structure comprises:
   forming a bit line on the second insulation layer to fill the third contact hole;
   forming a bit line mask on the bit line; and
   forming a bit line spacer on sidewalls of the bit line and the bit line mask.

* * * * *